(12) United States Patent
Nigam et al.

(10) Patent No.: US 9,245,599 B1
(45) Date of Patent: Jan. 26, 2016

(54) TIMED MULTIPLEX SENSING

(71) Applicant: SANDISK 3D LLC, Milpitas, CA (US)

(72) Inventors: Anurag Nigam, San Jose, CA (US); Gopinath Balakrishnan, San Jose, CA (US)

(73) Assignee: SANDISK 3D LLC, Milpitas, CA (US)

( * ) Notice: Subject to any disclaimer, the term of this patent is extended or adjusted under 35 U.S.C. 154(b) by 0 days.

(21) Appl. No.: 14/887,547

(22) Filed: Oct. 20, 2015

Related U.S. Application Data

(62) Division of application No. 14/191,130, filed on Feb. 26, 2014, now Pat. No. 9,196,373.

(51) Int. Cl.
  *G11C 13/00* (2006.01)
  *G11C 7/08* (2006.01)
  *G11C 16/26* (2006.01)
  *G11C 16/04* (2006.01)

(52) U.S. Cl.
  CPC ........... *G11C 7/08* (2013.01); *G11C 13/004* (2013.01); *G11C 16/0483* (2013.01); *G11C 16/26* (2013.01); *G11C 13/0069* (2013.01)

(58) Field of Classification Search
  CPC ........... G11C 13/0004; G11C 13/0069; G11C 11/5678
  USPC ..................... 365/163, 130, 113, 171
  See application file for complete search history.

(56) References Cited

U.S. PATENT DOCUMENTS

| | | | |
|---|---|---|---|
| 7,813,181 B2 | 10/2010 | Cernea | |
| 8,618,614 B2 | 12/2013 | Scheuerlein | |
| 8,885,428 B2 | 11/2014 | Chen | |
| 2007/0070690 A1* | 3/2007 | Scheuerlein | ....... G11C 11/5692 365/171 |
| 2013/0264631 A1 | 10/2013 | Alsmeier | |

* cited by examiner

*Primary Examiner* — Jason Lappas
(74) *Attorney, Agent, or Firm* — Vierra Magen Marcus LLP

(57) ABSTRACT

Methods for determining memory cell states during a read operation using a detection scheme that reduces the area of detection circuitry for detecting the states of the memory cells by time multiplexing the use of portions of the detection circuitry are described. The read operation may include a precharge phase, a sensing phase, and a detection phase. In some embodiments, a first bit line and a second bit line may be precharged to a read voltage in parallel, and then sensing and/or detection of selected memory cells corresponding with the first bit line and the second bit line may be performed serially using the same detection circuitry by time multiplexing the use of the detection circuitry. In some cases, the time multiplexed detection circuitry may be used for detecting two or more states corresponding with two or more memory cells being sensed during a read operation.

20 Claims, 20 Drawing Sheets

TIMED MULTIPLEX SENSING

CLAIM OF PRIORITY

The present application is a divisional application of U.S. patent application Ser. No. 14/191,130, titled "TIMED MULTIPLEX SENSING," filed Feb. 26, 2014, which is herein incorporated by reference in its entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device (e.g., a flash memory device) allows information to be stored and retained even when the non-volatile memory device is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM may utilize floating-gate transistors. A floating-gate transistor may include a floating gate that is positioned above and insulated from a channel region of the floating-gate transistor. The channel region may be positioned between source and drain regions of the floating-gate transistor. A control gate may be positioned above and insulated from the floating gate. The threshold voltage of the floating-gate transistor may be controlled by setting the amount of charge stored on the floating gate. The amount of charge on the floating gate may be controlled using Fowler-Nordheim tunneling or hot-electron injection. The ability to adjust the threshold voltage allows a floating-gate transistor to act as a data storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates are referred to as a NAND string. NAND strings may be oriented in a horizontal or vertical orientation (e.g., a 3D NAND with vertical bit lines). In recent years, NAND flash memory has been scaled in order to reduce cost per bit. However, as process geometries shrink, many design and process challenges are presented. These challenges include increased variability in memory cell I-V characteristics and increased memory cell array noise during sensing.

DETAILED DESCRIPTION

Figure 1A:
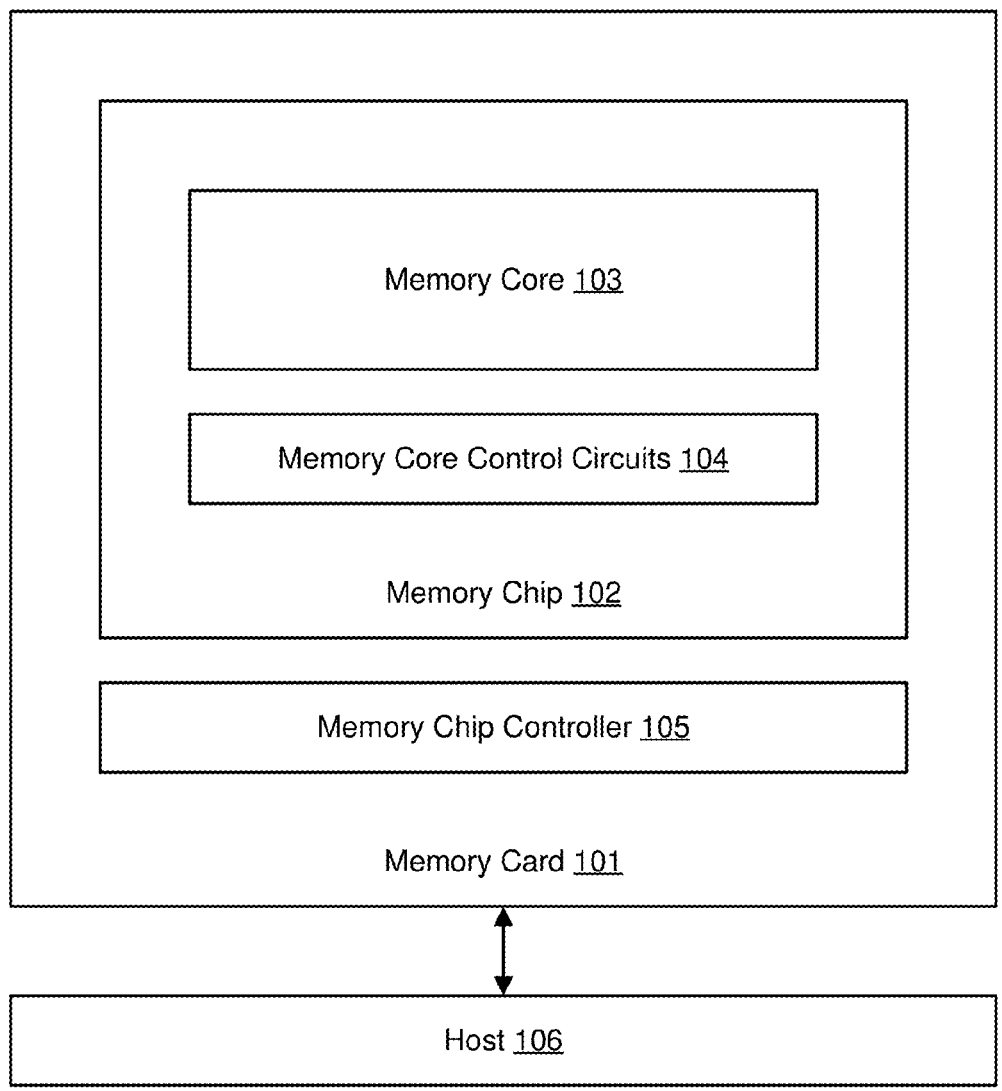
FIG. 1A depicts one embodiment of a memory system.

Technology is described for determining memory cell states during a read operation using a detection scheme that reduces the area of detection circuitry for detecting the states of the memory cells by time multiplexing the use of portions of the detection circuitry. The read operation may include a precharge phase (e.g., during which a bit line is precharged to a read voltage), a sensing phase (e.g., during which read current associated with a selected memory cell is integrated), and a detection phase (e.g., during which a state of a memory cell is determined using a comparator). In some embodiments, a first bit line and a second bit line may be precharged to a read voltage in parallel, and then sensing and/or detection of selected memory cells corresponding with the first bit line and the second bit line may be performed serially using the same detection circuitry by time multiplexing the use of the detection circuitry. In some cases, the time multiplexed detection circuitry may be used for detecting a plurality of states corresponding with a plurality of memory cells being sensed during a read operation (e.g., detecting the states of 2, 4, or 8 memory cells during the read operation). In one example, an eight input multiplexor may be used to time multiplex the outputs of eight different integration capacitors corresponding with the sensing of eight different memory cells to be compared with a read reference voltage using a comparator.

In some semiconductor memory technologies, increased variability in memory cell I-V characteristics and/or increased memory cell array noise during sensing (e.g., due to leakage currents through unselected memory cells connected to a selected bit line) may reduce the sensing window for a memory cell. The sensing window may refer to the difference between when a memory cell is deemed to be in a conducting state or a non-conducting state. The reduced sensing window may require more precise, area-intensive detection circuitry and/or a longer sensing time for determining the state of the memory cell. As an increase in the size of the detection circuitry may lead to an increase in die size (and manufacturing costs) and an increase in sensing time may increase memory cell read and/or write times, there is a need to implement higher precision detection circuitry without incurring a substantial memory area and/or memory performance penalty.

In some embodiments, a first sensing time associated with sensing a first memory cell connected to a first bit line may be different from (e.g., greater than) a second sensing time associated with sensing a second memory cell connected to a second bit line. In one embodiment, the first sensing time may be longer than the second sensing time if detection of a first state of the first memory cell is performed subsequent to the detection of a second state of the second memory cell. The longer sensing time may reduce the number of read errors during a read operation (e.g., a longer sensing time provides a weakly conducting memory cell with more time to discharge an integration capacitor). In one example, the time period during which the first state of the first memory cell is determined using detection circuitry may be assigned based on a history of previous read errors (e.g., if the first bit line is associated with a previous error or if the first bit line is associated with a page that had an ECC error during a previous read operation).

FIG. 1A depicts one embodiment of a memory system 100. Memory system 100 includes a host 106 (e.g., a personal computer or mobile computing device) and a memory card 101. The memory card 101 includes a memory chip controller 105 and a memory chip 102. The memory chip controller 105 may include one or more state machines, page registers, SRAM, or other control logic for controlling the operation of memory chip 102. The one or more state machines, page registers, SRAM, and/or other control logic for controlling the operation of the memory chip may be referred to as managing or control circuits for facilitating one or more memory array operations including erasing, programming, or reading operations. The memory chip controller may receive data and commands from host 106 and provides memory chip data to host 106.

In one embodiment, the memory chip controller 105 and memory chip 102 may be arranged on a single integrated circuit. In other embodiments, memory chip controller 105 and memory chip 102 may be arranged on different integrated circuits. The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 and memory core 103 are arranged on different integrated circuits.

Referring to FIG. 1A, a memory card operation may be initiated when host 106 sends instructions to memory chip controller 105 indicating that it would like to read data from memory card 101 or write data to memory card 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

Figure 1B:
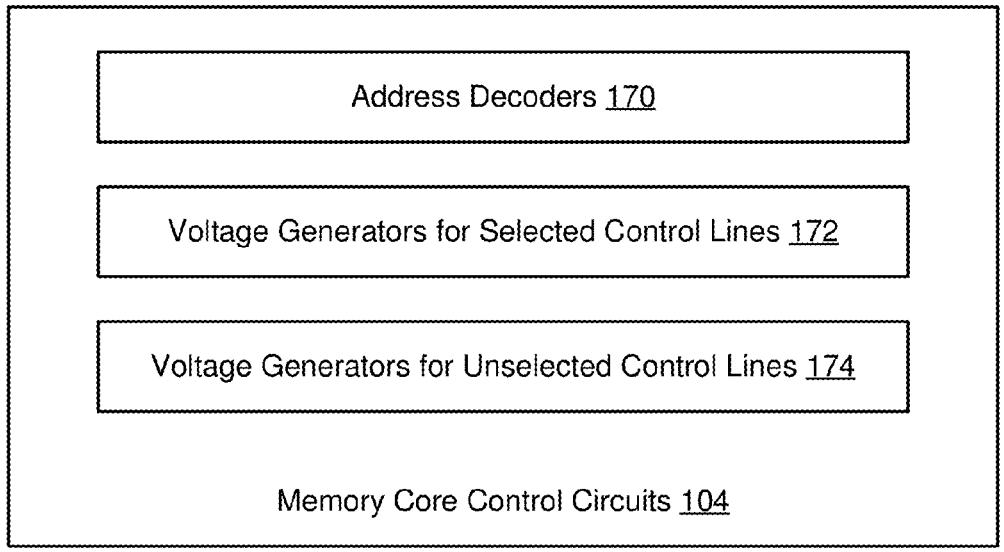
FIG. 1B depicts one embodiment of memory core control circuits.

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
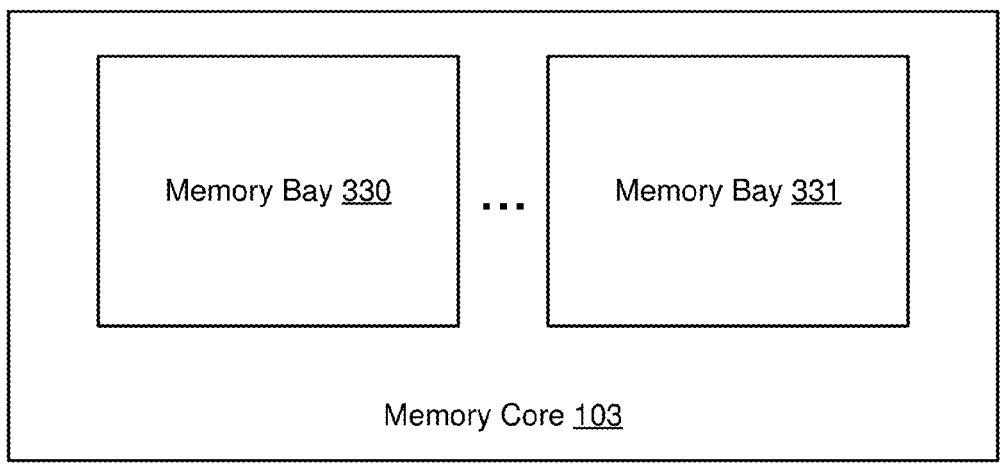
FIG. 1C depicts one embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
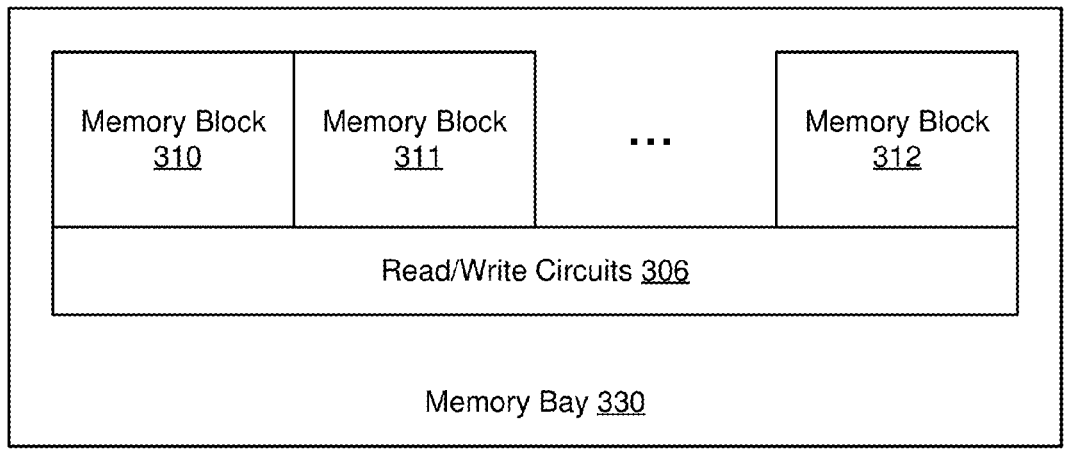
FIG. 1D depicts one embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block should be electrically coupled to read/write circuits 306 at a particular time to avoid signal conflicts.

Figure 1E:
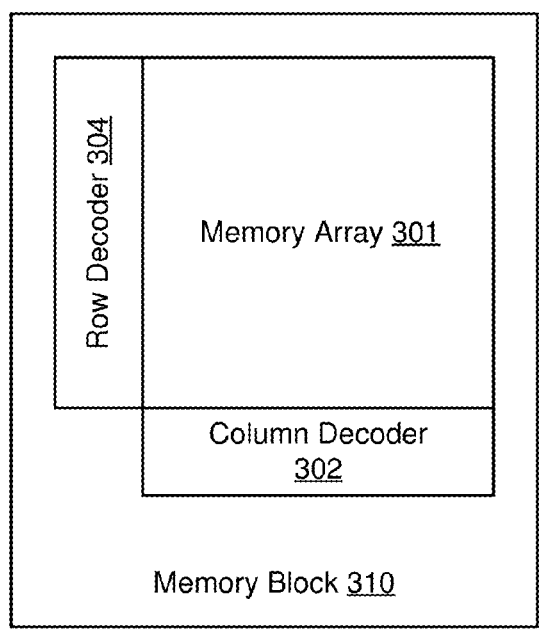
FIG. 1E depicts one embodiment of a memory block.

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

In some cases, a semiconductor memory array may include a cross-point memory array. A cross-point memory array comprises a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a phase change material or a ferroelectric material. In some cases, each memory cell in a cross-point memory array may be placed in series with a steering element, such as a diode, in order to reduce leakage currents associated with unselected memory cells.

Figure 1F:
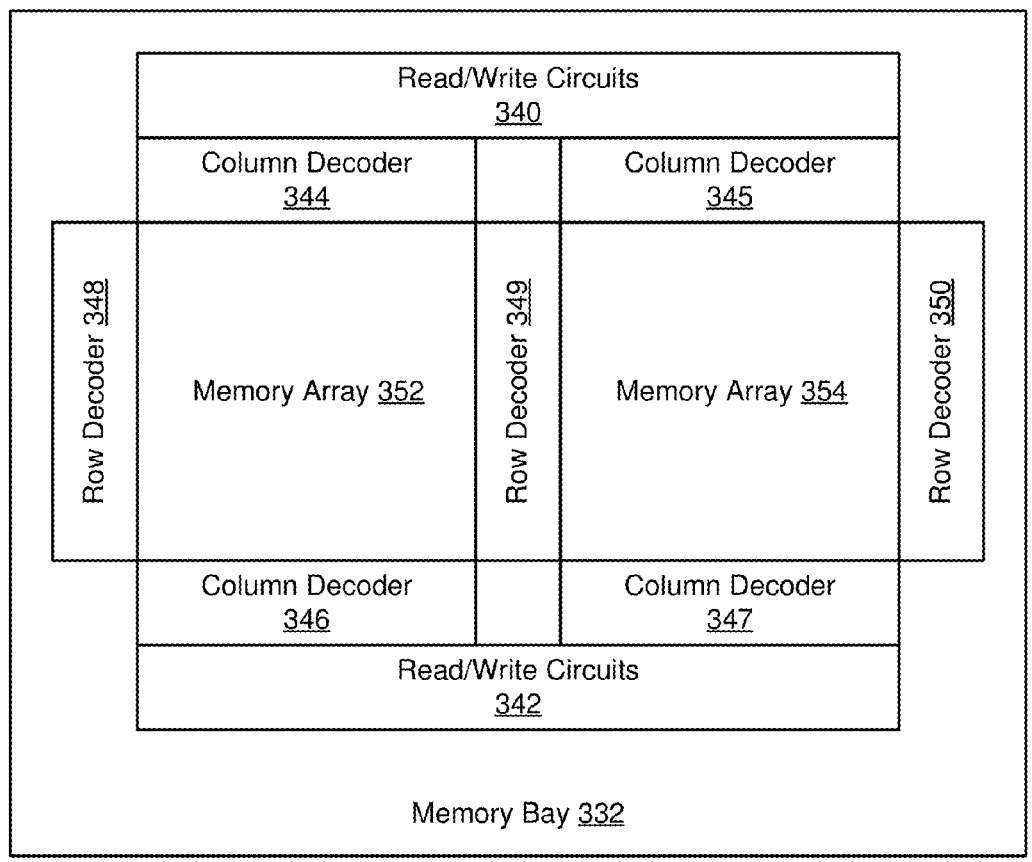
FIG. 1F depicts another embodiment of a memory bay.

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split allows for a more efficient layout of the memory bay.

Figure 2A:
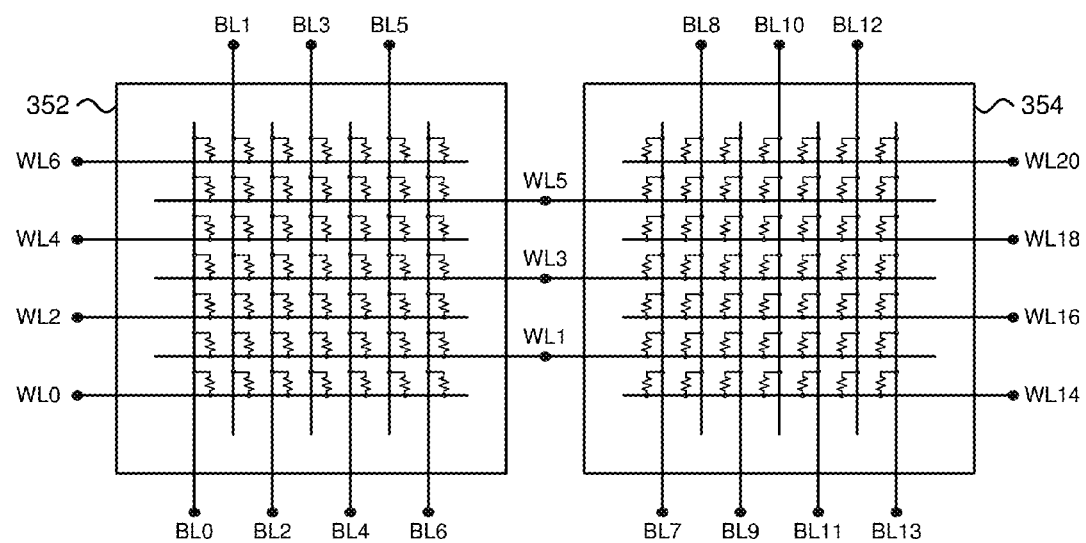
FIG. 2A depicts one embodiment of a schematic diagram corresponding with the memory bay of FIG. 1F.

FIG. 2A depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical to the supporting substrate (i.e., the vertical plane is perpendicular to the supporting substrate).

Figure 2B:
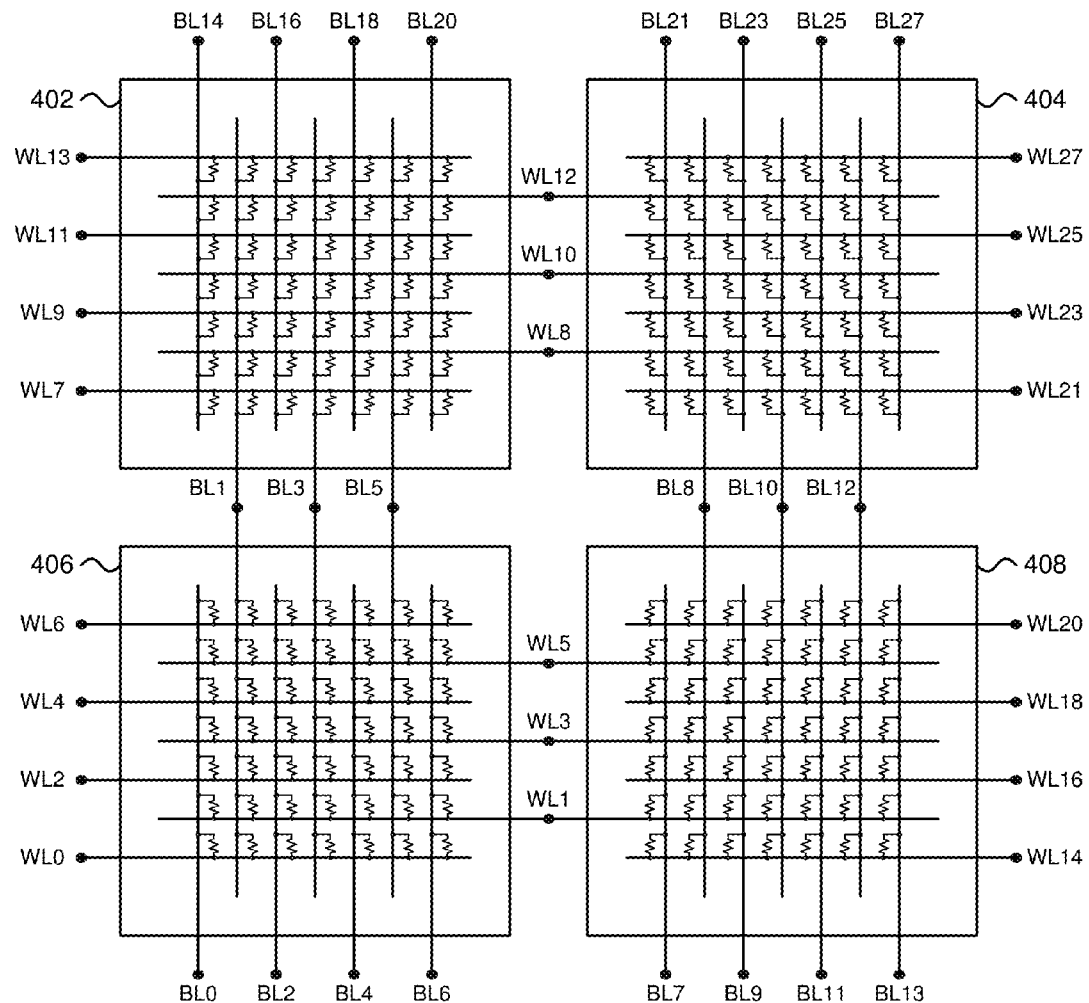
FIG. 2B depicts one embodiment of a schematic diagram corresponding with a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 3A:
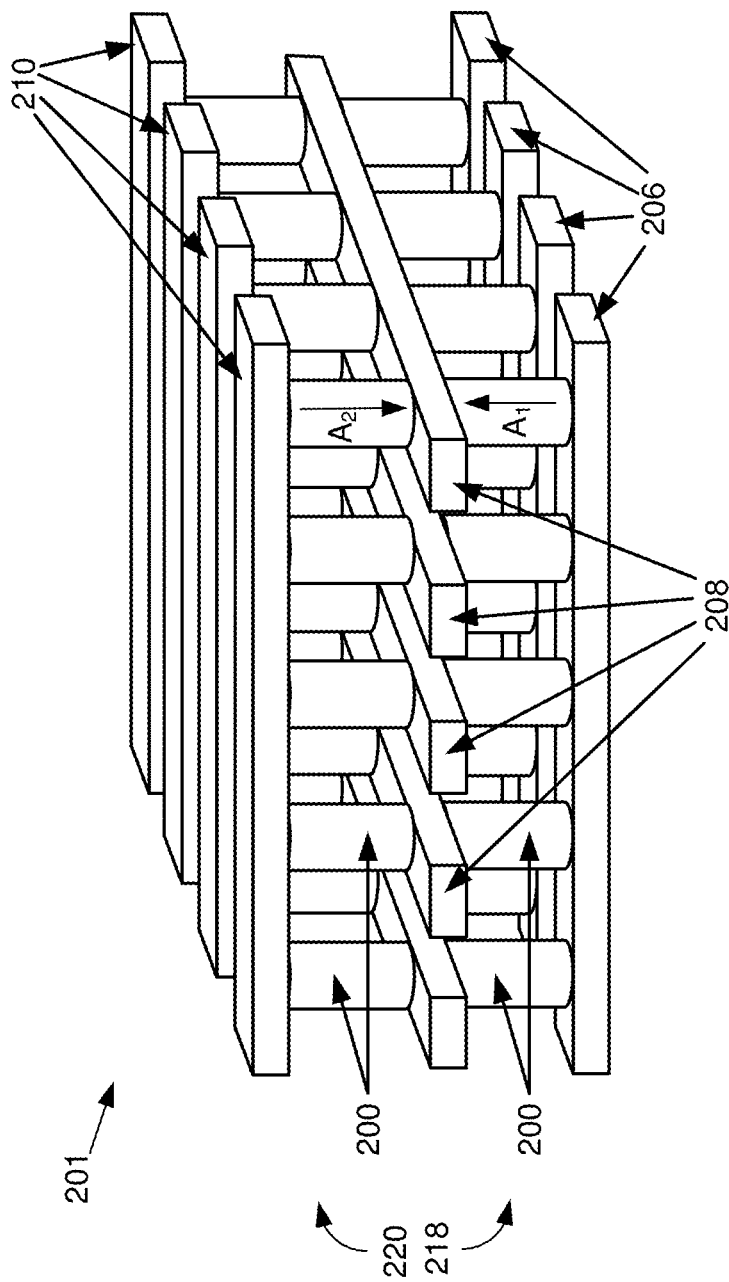
FIG. 3A depicts one embodiment of a portion of a monolithic three-dimensional memory array.

FIG. 3A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 3A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes only a state change element. The absence of a diode from a memory cell may reduce the process complexity and costs associated with manufacturing a memory array.

In one embodiment, the memory cells 200 of FIG. 3A include re-writable non-volatile memory cells. In one example, U.S. Patent Application Publication No. 2006/0250836, which is herein incorporated by reference in its entirety, describes a rewriteable non-volatile memory cell that includes a diode coupled in series with a reversible resistance-switching element. A reversible resistance-switching element includes reversible resistivity-switching material having a resistivity that may be reversibly switched between two or more states. In one embodiment, the reversible resistance-switching material may include a metal oxide. The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 3A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 3A, in one embodiment of a read operation, the data stored in one of the plurality of memory cells 200 may be read by biasing one of the word lines (i.e., the selected word line) to the selected word line voltage in read mode (e.g., 0V). A read circuit is then used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line will place a large voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. Leakage current may be subtracted out by using the auto zero current sensing.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation is similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "0" and the low-resistivity state may be associated with binary data "1." In other embodiments, SETTING and RESETTING operations and/or the data encoding can be reversed. In some embodiments, the first time a resistance-switching element is SET requires a higher than normal voltage and is referred to as a FORMING operation.

Referring to FIG. 3A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3B:
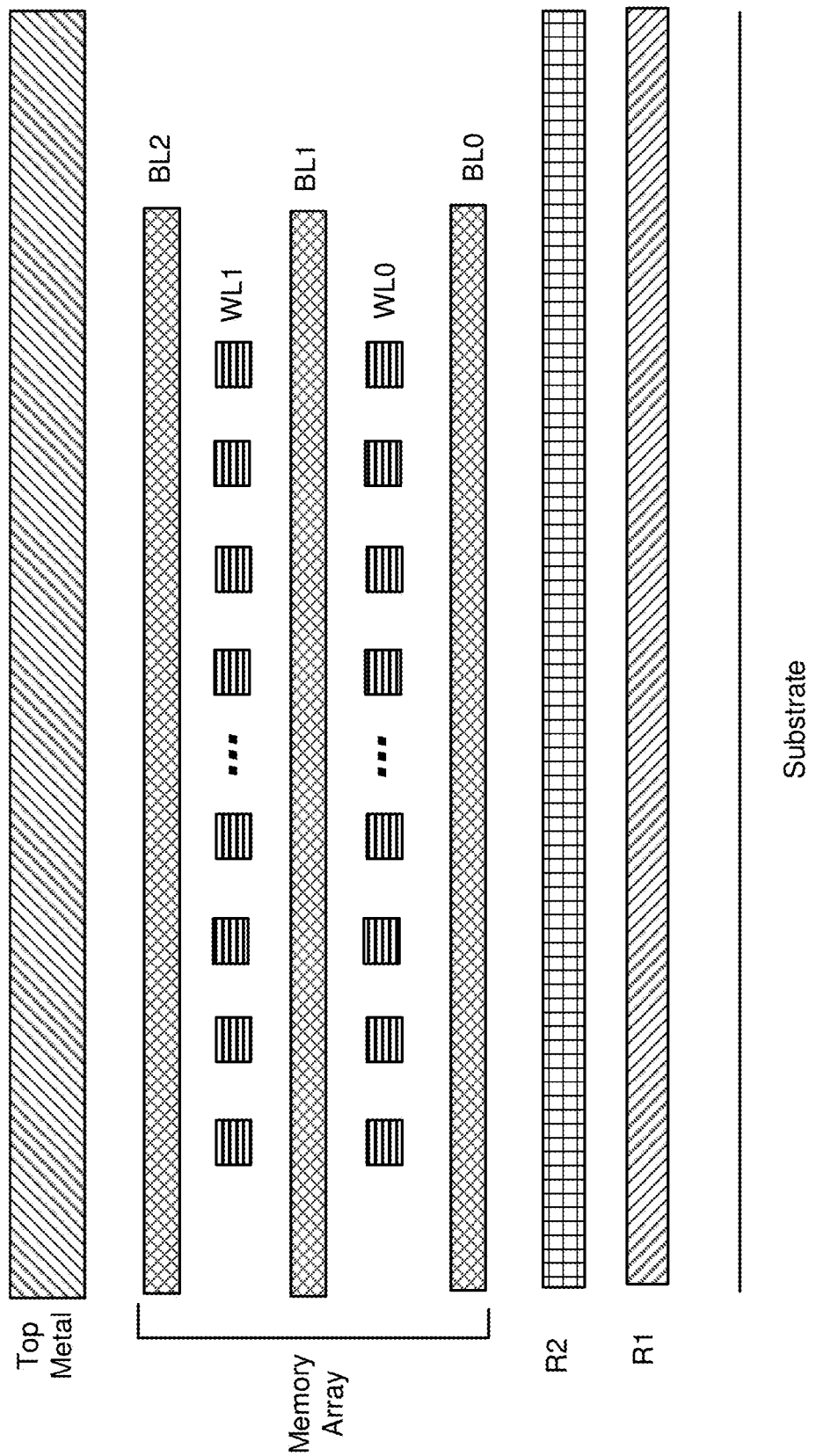
FIG. 3B depicts a subset of the memory array and routing layers of one embodiment of a three-dimensional memory array.

FIG. 3B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3B, two metal layers R1 and R2 are used for routing layers; however, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit such as the Top Metal layer. In one example, the Top Metal layer is formed of copper or aluminum (about 0.05 ohms/square), which may provide a smaller resistance per unit area than layers R1 and R2. Metals layers R1 and R2 may not be implemented using the same materials as those used for the Top Metal layers because the metal used for R1 and R2 must be able to withstand the processing steps for fabricating the Memory Array layers on top of R1 and R2.

Figure 3C:
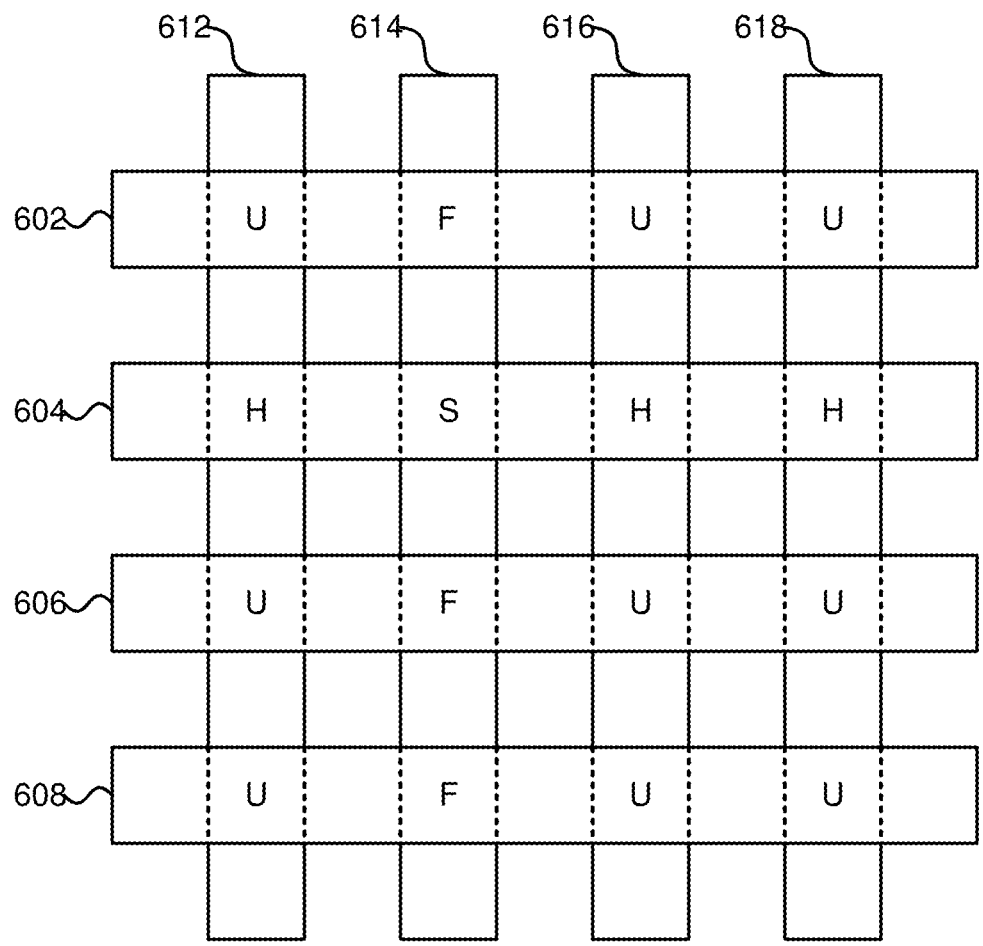
FIG. 3C-3D depicts embodiments of a cross-point memory array.

FIG. 3C depicts one embodiment of a cross-point memory array 610. The cross-point memory array 610 may correspond with memory array 201 in FIG. 3A. As depicted, cross-point memory array 610 includes word lines 602-608 and bit lines 612-618. Word line 604 comprises a selected word line and bit line 614 comprises a selected bit line. At the intersection of selected word line 604 and selected bit line 614 is a selected memory cell (an S cell). The voltage across the S cell is the difference between the selected word line voltage and the selected bit line voltage. Memory cells at the intersections of the selected word line 604 and the unselected bit lines 612, 616, and 618 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 614 and the unselected word lines 602, 606, and 608 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 602, 606, and 608 and the unselected bit lines 612, 616, and 618 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 602, may be associated with a particular page stored within the cross-point memory array 610.

Figure 3D:
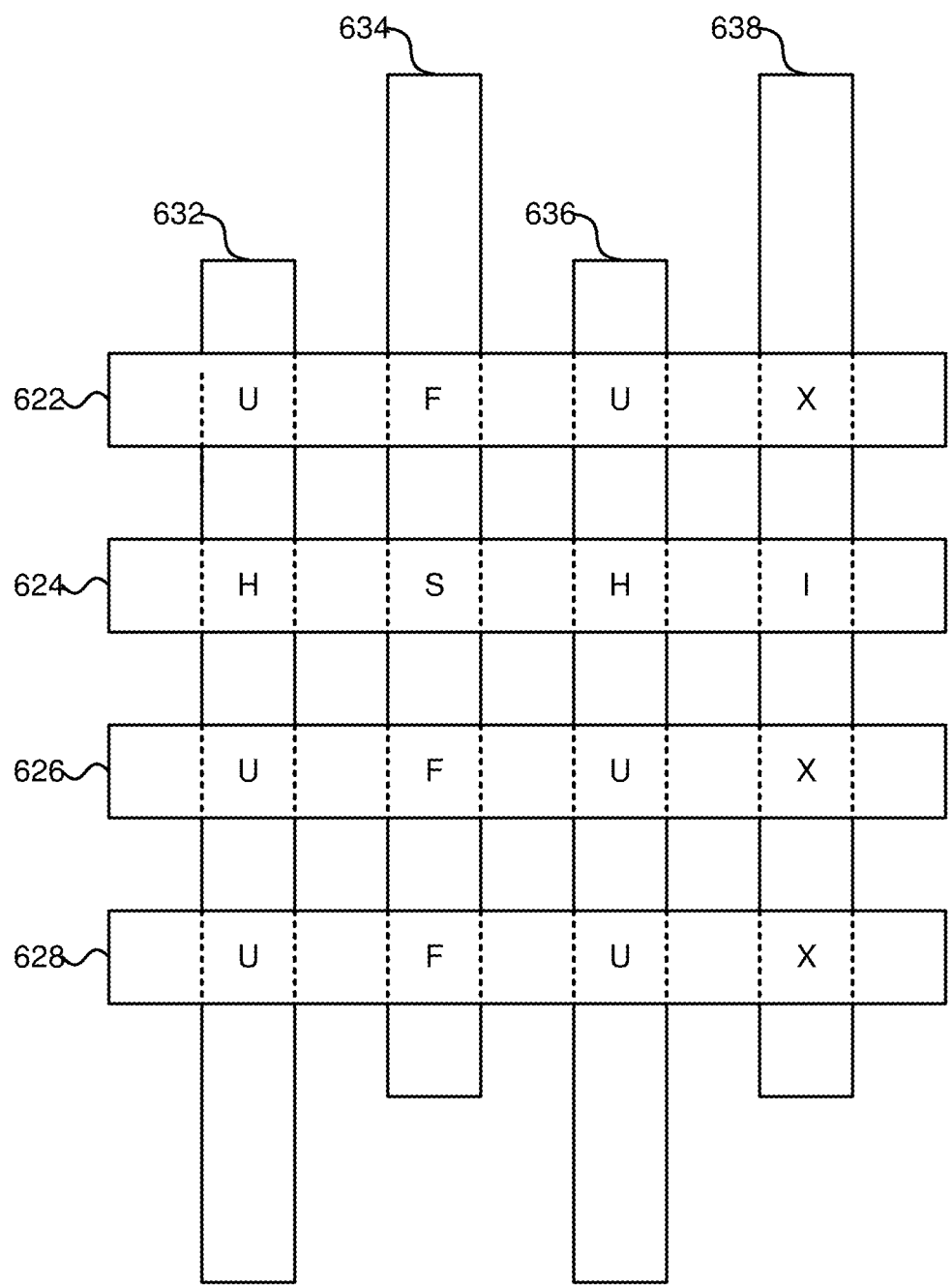

FIG. 3D depicts an alternative embodiment of a cross-point memory array 620. The cross-point memory array 620 may correspond with memory array 201 in FIG. 3A. As depicted, cross-point memory array 620 includes word lines 622-628 and bit lines 632-638. Word line 624 comprises a selected word line and bit lines 634 and 638 comprise selected bit lines. Although both bit lines 634 and 638 are selected, the voltages applied to bit line 634 and bit line 638 may be different. For example, in the case that bit line 634 is associated with a first memory cell to be programmed (i.e., an S cell), then bit line 634 may be biased to a selected bit line voltage in order to program the first memory cell. In the case that bit line 638 is associated with a second memory cell that is not to be programmed (i.e., an I cell), then bit line 638 may be biased to a program inhibit voltage (i.e., to a bit line voltage that will prevent the second memory cell from being programmed).

At the intersection of selected word line 624 and selected bit line 638 is a program inhibited memory cell (an I cell). The voltage across the I cell is the difference between the selected word line voltage and the program inhibit voltage. Memory cells at the intersections of the selected bit line 638 and the unselected word lines 622, 626, and 628 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 638 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 622 may be associated with a first page and a second page. The first page may correspond with bit lines 632 and 636 and the second page may correspond with bit lines 634 and 638. In this case, the first page and the second page may correspond with interdigitated memory cells that share the same word line. When a memory array operation is being performed on the first page (e.g., a programming operation) and the selected word line 624 is biased to the selected word line voltage, one or more other pages also associated with the selected word line 624 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 620 may comprise resistive memory elements without isolating diodes. In another embodiment, a floating control line (e.g., bit line 636) comprises a portion of the memory array that may be undriven during an operation on memory cell S using a first selected control line (e.g., bit line 634). Selection devices connected to control line 636 may be turned off during the memory operation causing control line 636 to be floating. Since a portion of the memory cells connected to the control lines 634 and 636 are also connected to shared unselected second control lines 622, 626, and 628, the floating control lines will float to a voltage substantially the same as the voltage of the unselected second control lines. In one embodiment, the control lines 634 and 636 may comprise vertical bit lines in a three dimensional memory array comprising comb shaped word lines. More information regarding vertical bit line three dimensional memory arrays can be found in U.S. Provisional Application 61/526,764, "Optimized Architecture for Three Dimensional Non-Volatile Storage Device with Vertical Bit Lines" and U.S. patent application Ser. No. 13/323,573, "Three Dimensional Non-Volatile Storage with Multi Block Row Selection," both of which are herein incorporated by reference in their entirety.

Figure 4:
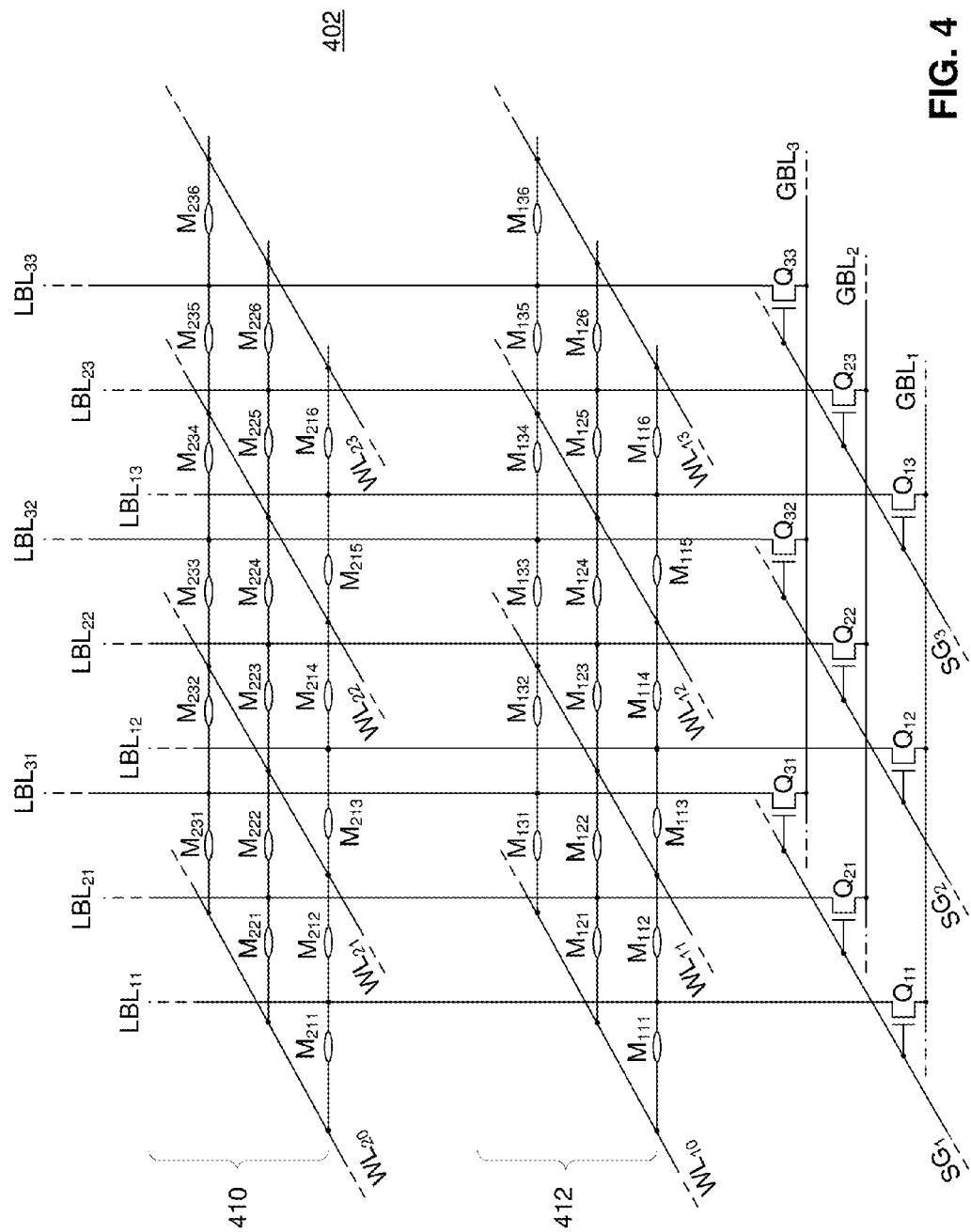
FIG. 4 depicts one embodiment of a portion of a monolithic three-dimensional memory array.

FIG. 4 depicts one embodiment of a portion of a monolithic three-dimensional memory array 402 that includes a first memory level 412 positioned below a second memory level 410. Memory array 402 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). The particular memory cell may comprise a floating gate device or a charge trap device (e.g., using a silicon nitride material). The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 402, includes a greater number of memory cells along the word lines as compared with the number of memory cells along the bit lines. For example, the number memory cells along each bit line may be 16, while the number of memory cells along each word line may be 2048.

More information regarding the structure and operation of vertical bit line memory arrays may be found in U.S. Provisional Application 61/423,007, "Non-Volatile Memory Having 3D Array of Read/Write Elements With Vertical Bit Lines and Laterally Aligned Active Elements and Methods Thereof" and U.S. patent application Ser. No. 13/323,703, "Three Dimensional Non-Volatile Storage with Three Device Driver for Row Select," both of which are herein incorporated by reference in their entirety.

Other three-dimensional memory array structures including vertical bit lines may also be used. More information regarding the structure and operation of three-dimensional memory arrays including vertical NAND strings may be found in U.S. patent application Ser. No. 13/443,287, "Vertical NAND Device with Low Capacitance and Silicided Word Lines" and U.S. patent application Ser. No. 13/875,854, "Method of Making Ultrahigh Density Vertical NAND Memory Device," both of which are herein incorporated by reference in their entirety.

Figure 5A:
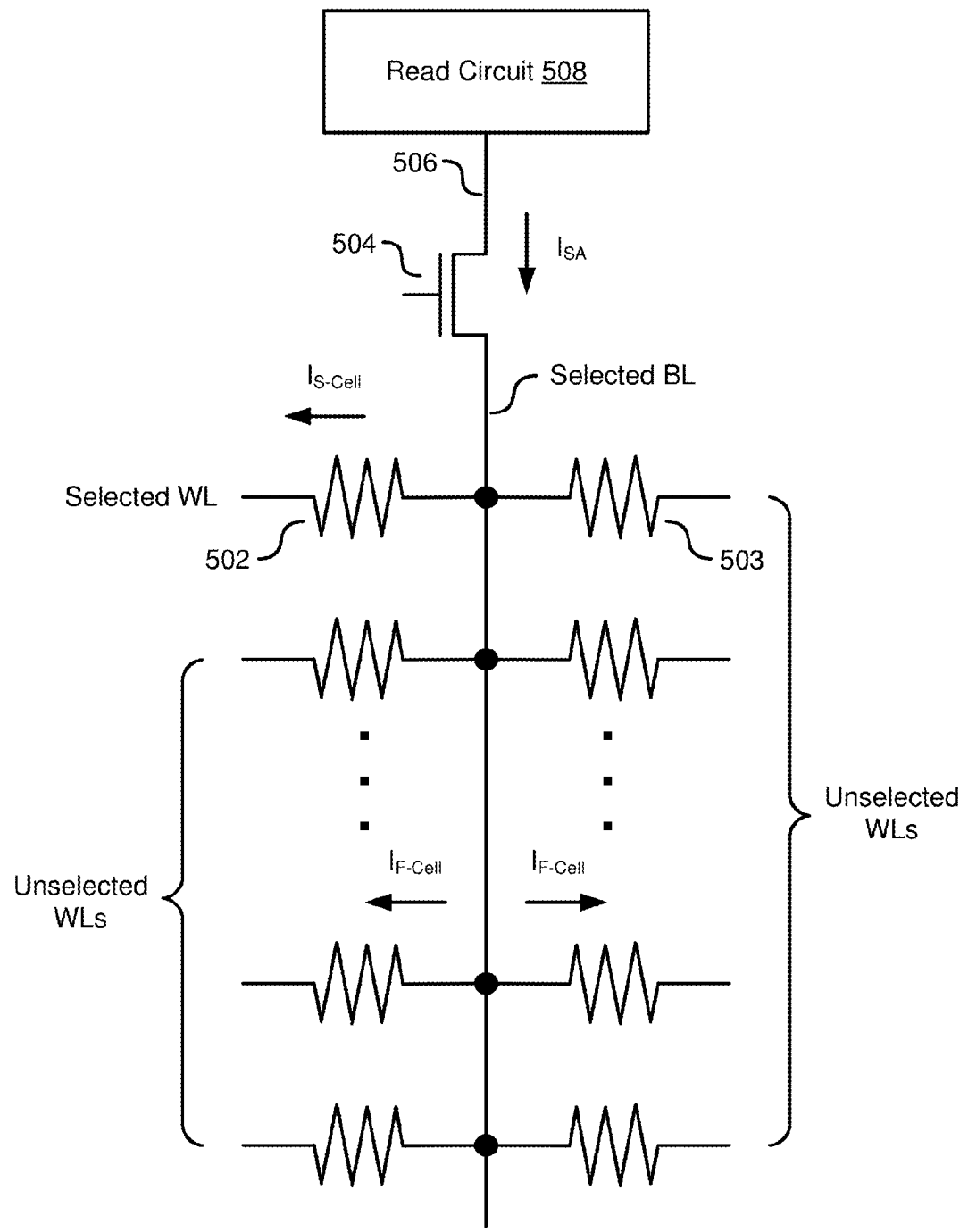
FIG. 5A depicts one embodiment of a read circuit for determining a state of a memory cell.

FIG. 5A depicts one embodiment of a read circuit 508 for determining a state of a memory cell. The read circuit 508 may include precharge logic for precharging a selected bit line, sensing logic for sensing current drawn from the selected bit line, and detection logic for determining a state of a memory cell associated with the selected bit line. As depicted, the output 506 of read circuit 508 drives a bit line select device 504 that is connected to a selected bit line (Selected BL). During sensing of a selected memory cell 502 connected to the selected bit line, a current ($I_{SA}$) may be drawn from the read circuit 508 based on the current through the selected memory cell 502 ($I_{S-CELL}$) and the leakage currents through the unselected memory cells (e.g., unselected memory cell 503) also connected to the selected bit line ($I_{F-CELL}$). In one embodiment, the selected bit line may be precharged to a read voltage (e.g., 1.0V), the selected word line (Selected WL) may be set to a selected word line voltage (e.g., 0V), and the unselected word lines (Unselected WLs) may be set to an unselected word line voltage (e.g., 0.9V or 1.0V). The read circuit 508 may include an integration capacitor that is discharged by the current drawn from the selected bit line for a sensing time period (e.g., 1.5 μs). In some cases, the read circuit 508 may include leakage correction circuitry for minimizing the impact of the leakage currents through the unselected memory cells connected to the selected bit line. In one example, the leakage correction circuitry may charge the integration capacitor based on the leakage currents over a period of time equivalent to the sensing time period during which the integration capacitor is discharged by the current through the selected memory cell 502.

Figure 5B:
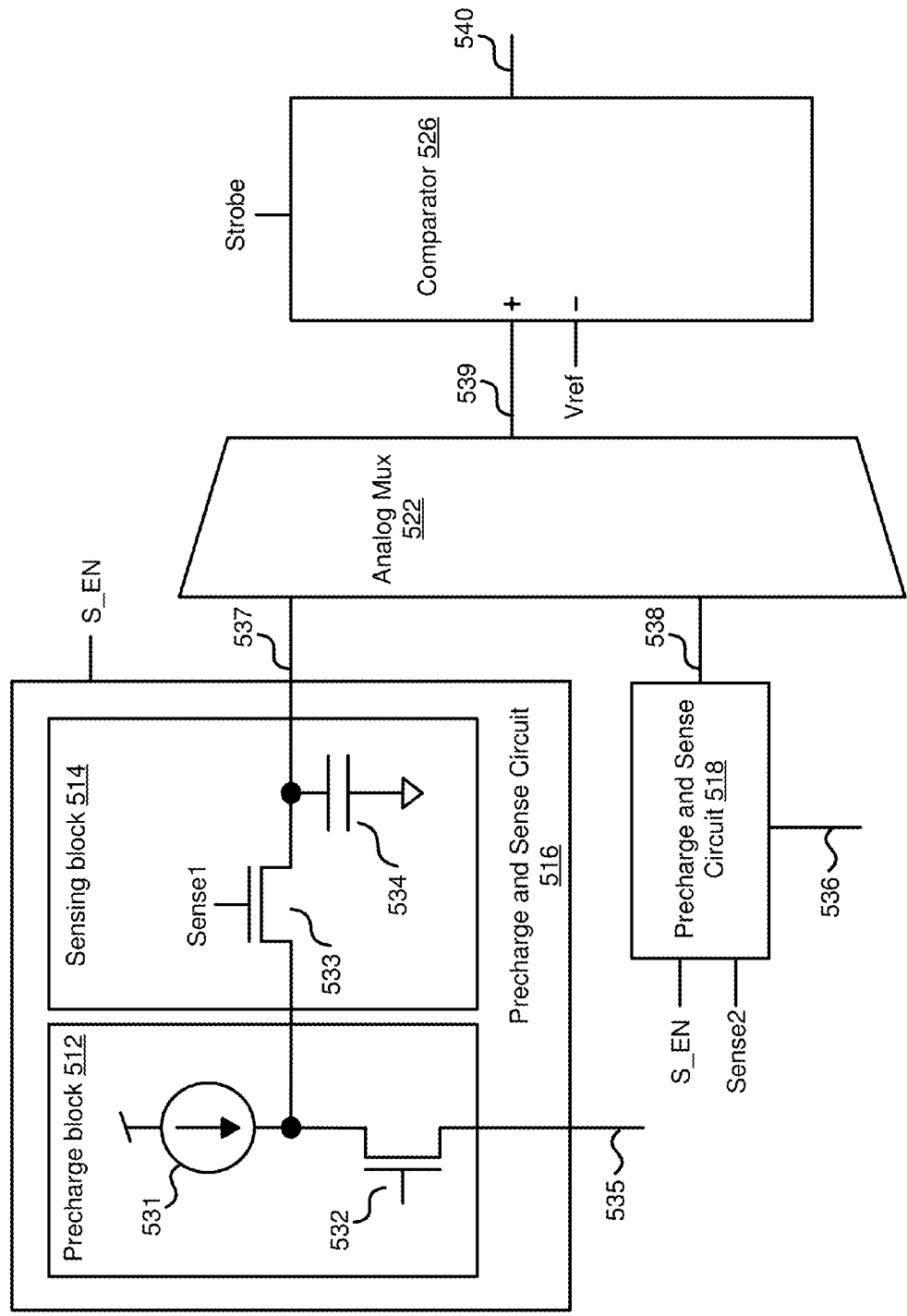
FIG. 5B depicts one embodiment of a read circuit for determining memory cell states during a read operation.

FIG. 5B depicts one embodiment of a read circuit for determining memory cell states during a read operation, such as read circuit 508 in FIG. 5A. As depicted, the read circuit includes a comparator 526, analog mux 522, precharge and sense circuit 516, and precharge and sense circuit 518. The precharge and sense circuit 516 includes a precharge block 512 and a sensing block 514. The precharge block 512 includes a bias transistor 532 (e.g., used in a source-follower configuration) for biasing a first selected bit line to a read voltage and a current reference 531 (e.g., for comparing the current drawn by the first selected bit line during sensing or for limiting the amount of current drawn by the first selected bit line during precharging of the first selected bit line).

The sensing block 514 includes a switch transistor 533 for electrically connecting an integration capacitor 534 to the first selected bit line during a sensing operation (e.g., when the gate of the switch transistor 533 driven by the sense signal Sense1 allows the switch transistor 533 to be in a conducting state). The precharge and sense circuit 516 electrically connects to (or is in communication with) the first selected bit line via the output 535 from the precharge block 512 and electrically connects to analog mux 522 via the output 537 from the sensing block 514. The output 535 may electrically connect to the first selected bit line via one or more bit lines select device, such as bit line select device 504 in FIG. 5A.

The precharge and sense circuit 518 electrically connects to a second selected bit line via output 536 and connects to the analog mux 522 via the output 538. The output 536 may electrically connect to the second selected bit line via one or more bit lines select device, such as bit line select device 504 in FIG. 5A. The sensing operation performed by the precharge and sense circuit 518 is enabled by the sense signal Sense2 that facilitates the electrical connection of a second integration capacitor within the precharge and sense circuit 518 to the second selected bit line. The enable signal (S_EN) enables use of the read circuitry for determining memory cell states during the read operation. The analog mux 522 selectively connects either the output 537 or the output 538 to the output 539 of the analog mux 522. The output 539 of the analog mux 522 connects to the comparator 526. The comparator 526 may compare the voltage of the output 539 of the analog mux with a reference voltage (Vref) and output a binary value or a digital value corresponding with whether the output 539 of the analog mux 522 is greater than the reference voltage at output 540 (e.g., if the output 539 of the analog mux 522 is greater than the reference voltage, then the output 540 of the comparator 526 may be a true value or "1"). The strobe signal (Strobe) enables the comparator 526 to perform the comparison of the output 539 of the analog mux 522 with the reference voltage. In one embodiment, the comparator may include a first-stage differential amplifier that takes the reference voltage (Vref) and the output 539 of the analog mux 522 as differential inputs.

As depicted, the output 537 of precharge and sense circuit 516 and the output 538 of precharge and sense circuit 518 may be electrically connected to the input 539 of the comparator during different time periods. Thus, the analog mux 522 allows the comparator 526 to be time multiplexed and used for detecting a first memory cell state associated with the first selected bit line during a first time period and detecting a second memory cell state associated with the second selected bit line during a second time period different from the first time period. In some embodiments, a multiplexor (or mux) may be used to time multiplex the outputs of two or more integration capacitors in order to enable the comparison of voltages associated with each of the two or more integration capacitors with the reference voltage.

In some cases, the sensing block 514 may include leakage correction circuitry for minimizing the impact of leakage currents associated with a selected bit line, such as leakage currents through unselected memory cells connected to the selected bit line. In one example, the leakage correction circuitry may charge the integration capacitor based on the leakage currents over a period of time equivalent to the sensing time period during which an integration capacitor is discharged by the current through a selected memory cell.

Figure 5C:
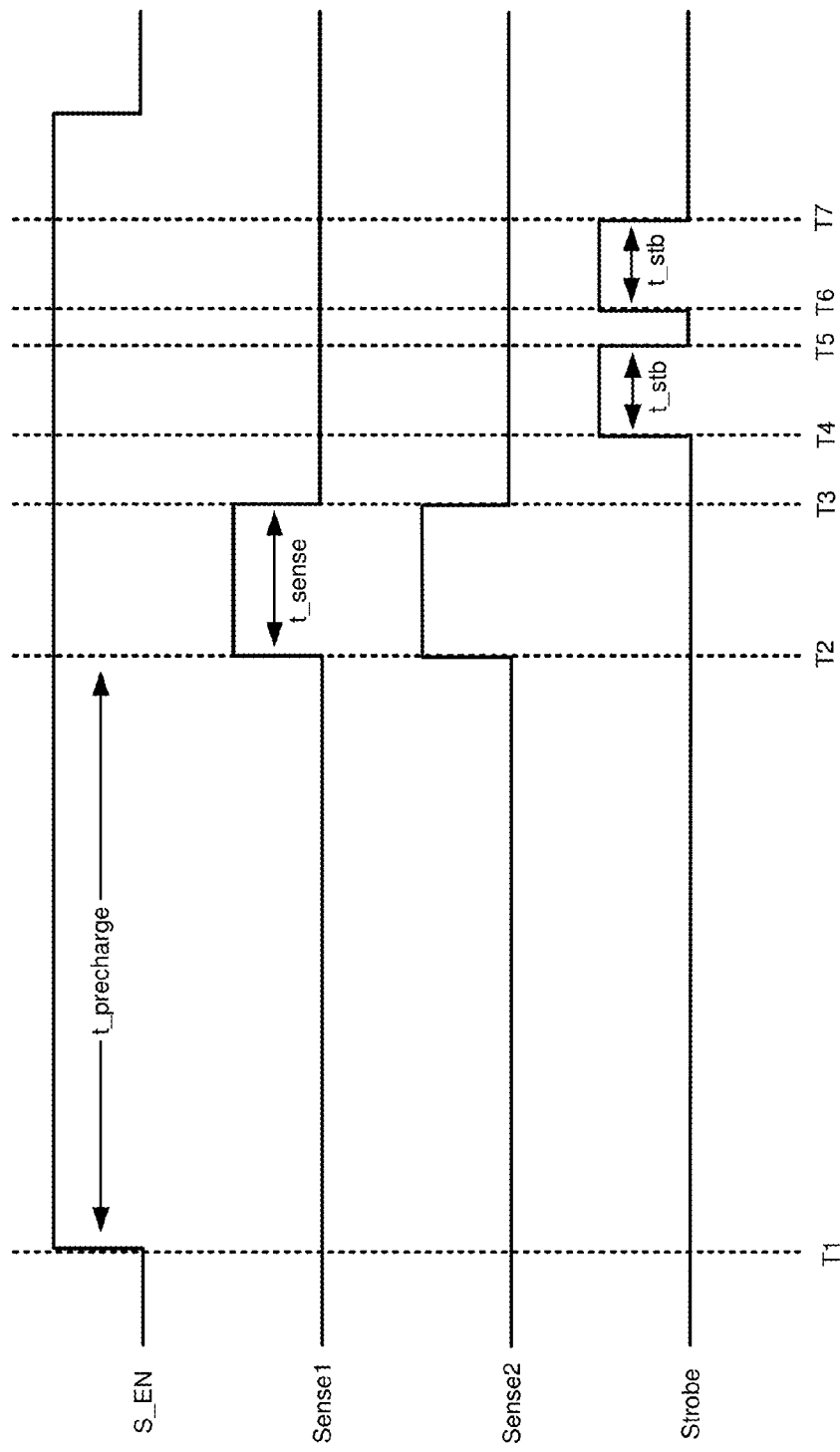
FIG. 5C depicts one embodiment of a method for operating the read circuit for determining memory cell states depicted in FIG. 5B.

FIG. 5C depicts one embodiment of a method for operating the read circuit for determining memory cell states depicted in FIG. 5B. As depicted, at time T1, enable signal S_EN goes high initiating the precharging of one or more bit lines to a read voltage (e.g., 1.0V). In one example, precharge and sense circuit 516 of FIG. 5B may set output 535 to the read voltage and precharge and sense circuit 518 of FIG. 5B may set output 536 to the read voltage. After a precharge time (e.g., 3.5 μs) has passed, the first selected bit line and the second selected bit line may be fully precharged to the read voltage. At time T2, the sense signal Sense1 goes high initiating the sensing of a first memory cell connected to the first selected bit line and the sense signal Sense2 goes high initiating the sensing of a second memory cell connected to the second selected bit line.

At time T3, after a sense time (e.g., 1.5 μs) has occurred from time T2, Sense1 may be set low stopping the sensing of the selected memory cells and preventing the discharging of the integration capacitors associated with precharge and sense circuits 516 and 518. At time T3, the voltages associated with the integration capacitors may be latched. Between times T3 and T4, the analog mux 522 may be set such that the first integration capacitor is electrically connected to the input of the comparator 526. At time T4, the comparator strobe signal Strobe is set high initiating the comparison of a voltage associated with a first integration capacitor (e.g., integration capacitor 534 of precharge and sense circuit 516 in FIG. 5B) with a reference voltage (e.g., Vref in FIG. 5B). At time T5, after a strobe time (e.g., 0.3 μs) has occurred from time T4, the strobe signal Strobe may be set low disabling the comparator 526 and latching the resulting digital value of the comparison. Between times T5 and T6, the analog mux 522 may be set such that a second integration capacitor is electrically connected to the input of the comparator 526. At time T6, the comparator strobe signal Strobe is set high initiating the comparison of a voltage associated with a second integration capacitor (e.g., an integration capacitor within precharge and sense circuit 518 in FIG. 5B) with the reference voltage. At time T7, after a strobe time (e.g., 0.3 μs) has occurred from time T6, the strobe signal Strobe may be set low disabling the comparator 526 and latching the resulting digital value of the comparison.

Figure 5D:
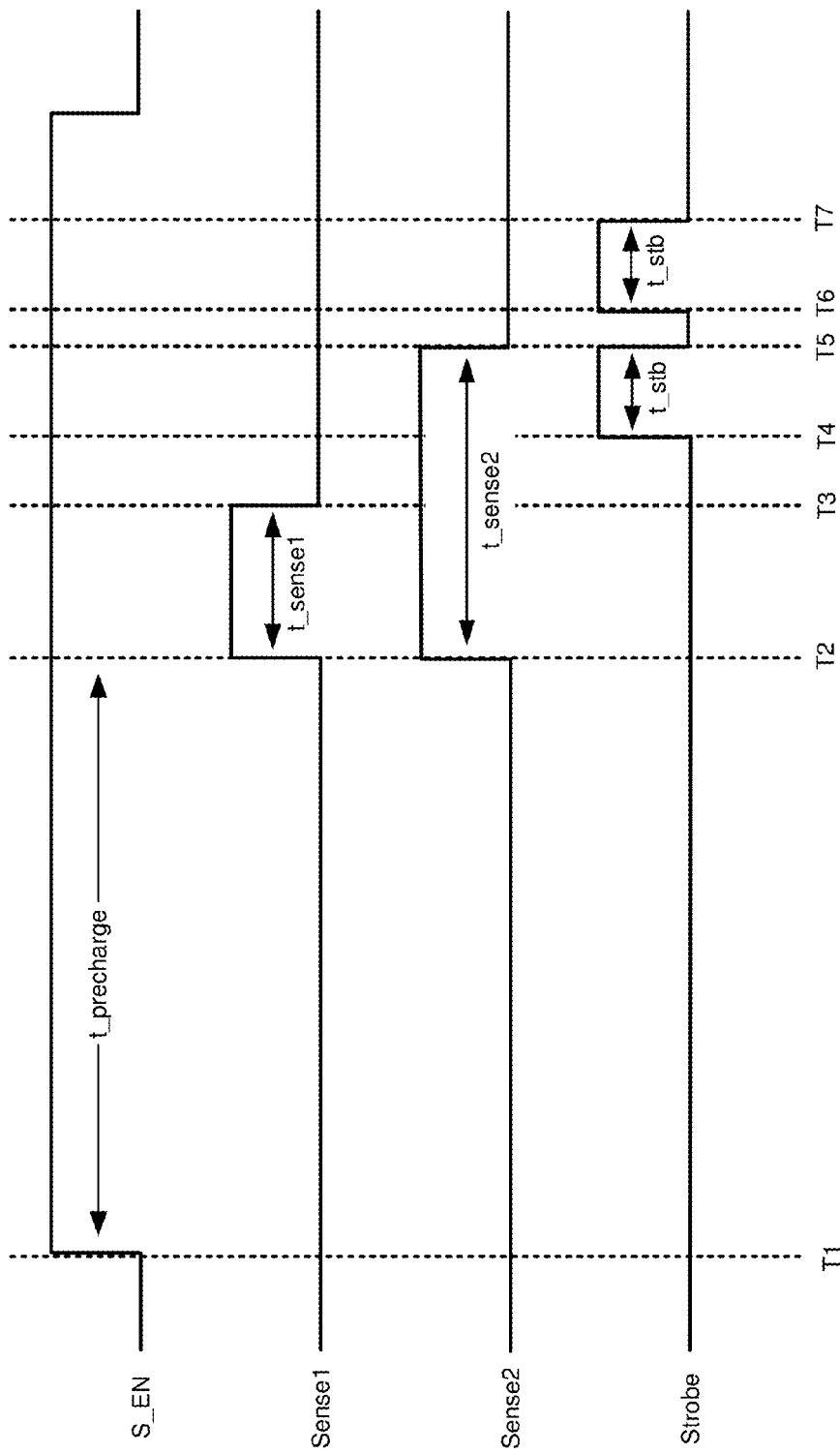
FIG. 5D depicts an alternative embodiment of a method for operating the read circuit for determining memory cell states depicted in FIG. 5B.

FIG. 5D depicts an alternative embodiment of a method for operating the read circuit for determining memory cell states depicted in FIG. 5B. As depicted, at time T1, enable signal S_EN goes high initiating the precharging of one or more bit lines to a read voltage (e.g., 1.0V). In one example, precharge and sense circuit 516 of FIG. 5B may set output 535 to the read voltage and precharge and sense circuit 518 of FIG. 5B may set output 536 to the read voltage. After a precharge time (e.g., 3.5 μs) has passed, the first selected bit line and the second selected bit line may be fully precharged to the read voltage. At time T2, the sense signal Sense1 goes high initiating the sensing of a first memory cell connected to the first selected bit line and the sense signal Sense2 goes high initiating the sensing of a second memory cell connected to the second selected bit line.

At time T3, after a first sense time (e.g., 1.5 μs) has occurred from time T2, Sense1 may be set low preventing the discharging of the integration capacitor associated with precharge and sense circuit 516 in FIG. 5B. At time T3, Sense2 remains high allowing the discharging of the integration capacitor associated with precharge and sense circuit 518 in FIG. 5B. In this case, the precharge and sense circuit 518 may continue to sense a second memory cell associated with the second selected bit line coupled to the precharge and sense circuit 518 as the detection time period (e.g., between times T6 and T7) for the second memory cell is subsequent to the detection time period (e.g., between times T4 and T5) for a first memory cell associated with the first selected bit line coupled to the precharge and sense circuit 516.

In some cases, a first sensing time associated with sensing a first memory cell connected to a first selected bit line may be different from (e.g., greater than or less than) a second sensing time associated with sensing a second memory cell connected to a second selected bit line. In one embodiment, the first sensing time may be longer than the second sensing time if detection of a first state of the first memory cell is performed subsequent to the detection of a second state of the second memory cell. The longer sensing time may reduce the number of read errors during a read operation (e.g., a longer sensing time may provide a weakly conducting memory cell with more time to discharge an integration capacitor). In one embodiment, the time period during which the first state of the first memory cell is determined using detection circuitry may be assigned based on a history of previous read errors (e.g., if the first bit line is associated with a previous error or if the first bit line is associated with a page that had an ECC error during a previous read operation). In one example, if the second selected bit line is associated with a previous read error, then a memory cell connected to the second selected bit line may be sensed during a longer second sensing time period (e.g., sensed between times T2 and T5, rather than between times T2 and T3).

As depicted in FIG. 5D, between times T3 and T4, the analog mux 522 may be set such that the first integration capacitor is electrically connected to the input of the comparator 526. At time T4, the comparator strobe signal Strobe is set high initiating the comparison of a voltage associated with a first integration capacitor (e.g., integration capacitor 534 of precharge and sense circuits 516 in FIG. 5B) with a reference voltage (e.g., Vref in FIG. 5B). At time T5, after a strobe time (e.g., 0.3 μs) has occurred from time T4, the strobe signal Strobe may be set low disabling the comparator 526 and latching the resulting digital value of the comparison.

At time T5, after a second sense time (e.g., 2.1 μs) has occurred from time T2, Sense2 may be set low preventing the discharging of the integration capacitor associated with precharge and sense circuit 518 in FIG. 5B. Between times T5 and T6, the analog mux 522 may be set such that a second integration capacitor is electrically connected to the input of the comparator 526. At time T6, the comparator strobe signal Strobe is set high initiating the comparison of a voltage associated with a second integration capacitor (e.g., an integration capacitor within precharge and sense circuit 518 in FIG. 5B) with the reference voltage. At time T7, after a strobe time (e.g., 0.3 μs) has occurred since time T6, the strobe signal Strobe may be set low disabling the comparator 526 and latching the resulting digital value of the comparison.

Figure 5E:
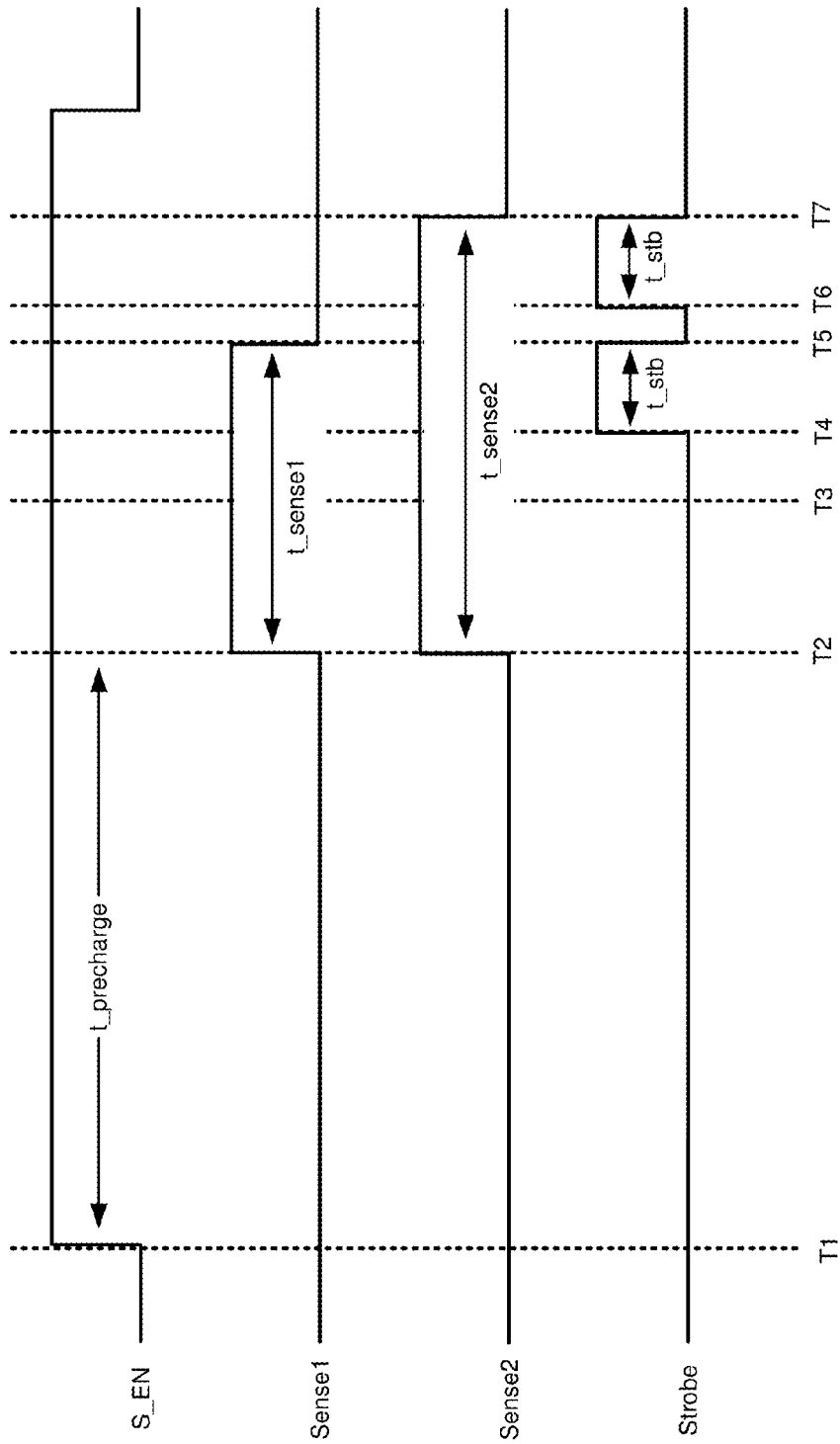
FIG. 5E depicts an alternative embodiment of a method for operating the read circuit for determining memory cell states depicted in FIG. 5B.

FIG. 5E depicts an alternative embodiment of a method for operating the read circuit for determining memory cell states depicted in FIG. 5B. The operation of the read circuit depicted in FIG. 5E is similar to that described with respect to FIG. 5D. As depicted, the sense signal Sense1 goes high at time T2 and falls at time T5 (i.e., the first sensing time period overlaps with the detection time period for a first memory cell connected to the first selected bit line) and the sense signal Sense2 goes high at time T2 and falls at time T7 (i.e., the second sensing time period overlaps with the detection time period for a second memory cell connected to the second selected bit line). The additional sensing time may lead to a reduction in read errors and/or lead to an increase in read bandwidth.

Figure 6A:
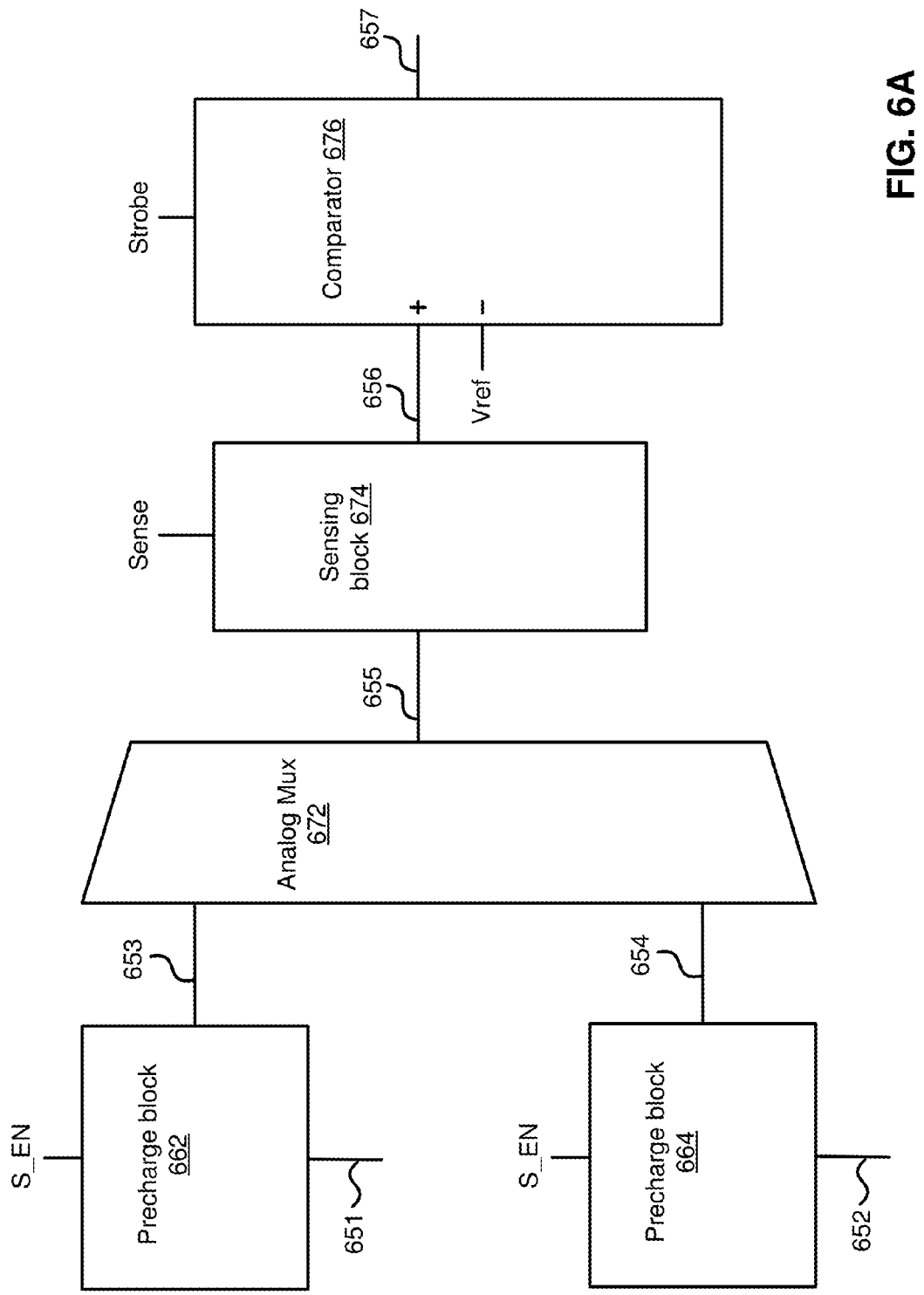
FIG. 6A depicts an alternative embodiment of a read circuit for determining memory cell states during a read operation.

FIG. 6A depicts an alternative embodiment of a read circuit, such as read circuit 508 in FIG. 5A, for determining memory cell states during a read operation. As depicted, the read circuit includes a comparator 676, analog mux 672, precharge block 662, precharge block 664, and sensing block 674. The precharge block 662 may correspond with precharge block 512 in FIG. 5B and the sensing block 674 may correspond with sensing block 514 in FIG. 5B. The sensing block 674 may correspond with sensing block 514 in FIG. 5B. The output 651 of precharge block 662 may electrically connect to a first selected bit line (e.g., via a bit line driver or a bit line select device) and the output 652 of precharge block 664 may electrically connect to a second selected bit line. The analog mux 672 may selectively connect either the output 653 of precharge block 662 or the output 654 of precharge block 664 with the input 655 of the sensing block 674. Comparator 676 takes as inputs the output 656 of the sensing block 674 and a reference voltage (Vref) and outputs a resulting digital value at output 657 based on a comparison of the inputs. Thus, the analog mux 672 allows both the comparator 676 and the sensing block 674 to be time multiplexed and used for sensing and detecting a first memory cell state associated with a first selected bit line during a first time period, and sensing and detecting a second memory cell state associated with a second selected bit line during a second time period subsequent to the first time period.

Figure 6B:
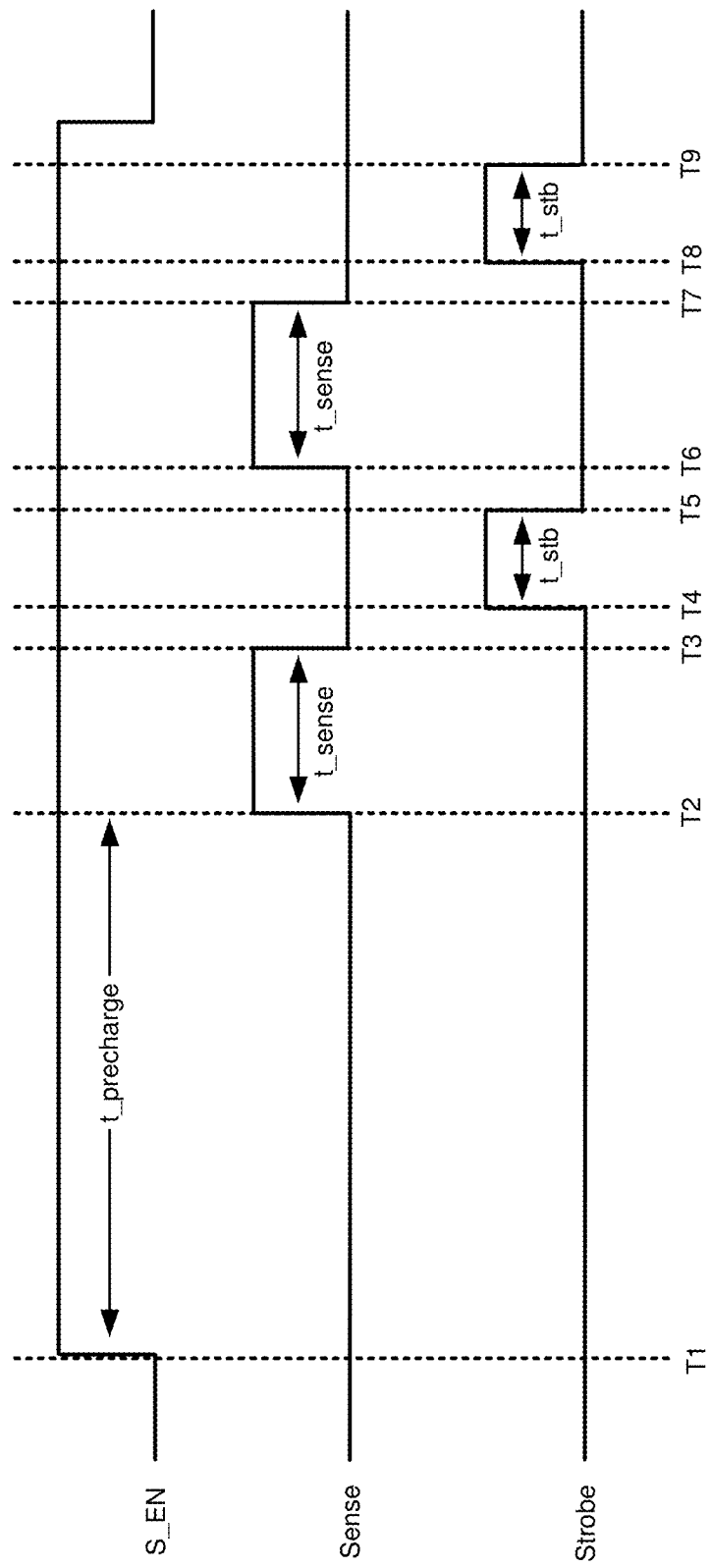
FIG. 6B depicts one embodiment of a method for operating the read circuit for determining memory cell states depicted in FIG. 6A.

FIG. 6B depicts one embodiment of a method for operating the read circuit for determining memory cell states depicted in FIG. 6A. As depicted, at time T1, enable signal S_EN goes high initiating the precharging of one or more bit lines to a read voltage (e.g., 1.0V). In one example, precharge block 662 of FIG. 6A may set output 651 to the read voltage and precharge block 664 of FIG. 6A may set output 652 to the read voltage. After a precharge time (e.g., 3.5 μs) has passed, the first selected bit line and the second selected bit line may be fully precharged to the read voltage. Prior to time T2, analog mux 672 may electrically connect output 653 of precharge block 662 to output 655 of the analog mux 672. At time T2, the sense signal Sense goes high initiating the sensing of a first memory cell connected to the first selected bit line. At time T3, after a sense time (e.g., 1.5 μs) has occurred from time T2, Sense may be set low stopping the sensing of the first memory cell and preventing the discharging of the integration capacitor associated with sensing block 674. Between times T4 and T5, comparator 676 compares a voltage associated with the integration capacitor with a reference voltage. Thus, between times T2 and T5, the sensing block 674 and the comparator 676 are time multiplexed such that they sense and detect the state of the first memory cell.

Between times T5 and T6, analog mux 672 may electrically connect output 654 of precharge block 664 to output 655 of the analog mux 672. Also between times T5 and T6, the voltage of the integration capacitor associated with sensing block 674 may be reset to a precharge value. At time T6, the sense signal Sense goes high initiating the sensing of a second memory cell connected to the second selected bit line. At time T7, after a sense time (e.g., 1.5 μs) has occurred from time T6, Sense may be set low stopping the sensing of the second memory cell and preventing the discharging of the integration capacitor associated with sensing block 674. Between times T8 and T9, comparator 676 compares a voltage associated with the integration capacitor with a reference voltage. Thus, between times T6 and T9, the sensing block 674 and the comparator 676 are time multiplexed such that they sense and detect the state of the second memory cell.

Figure 7A:
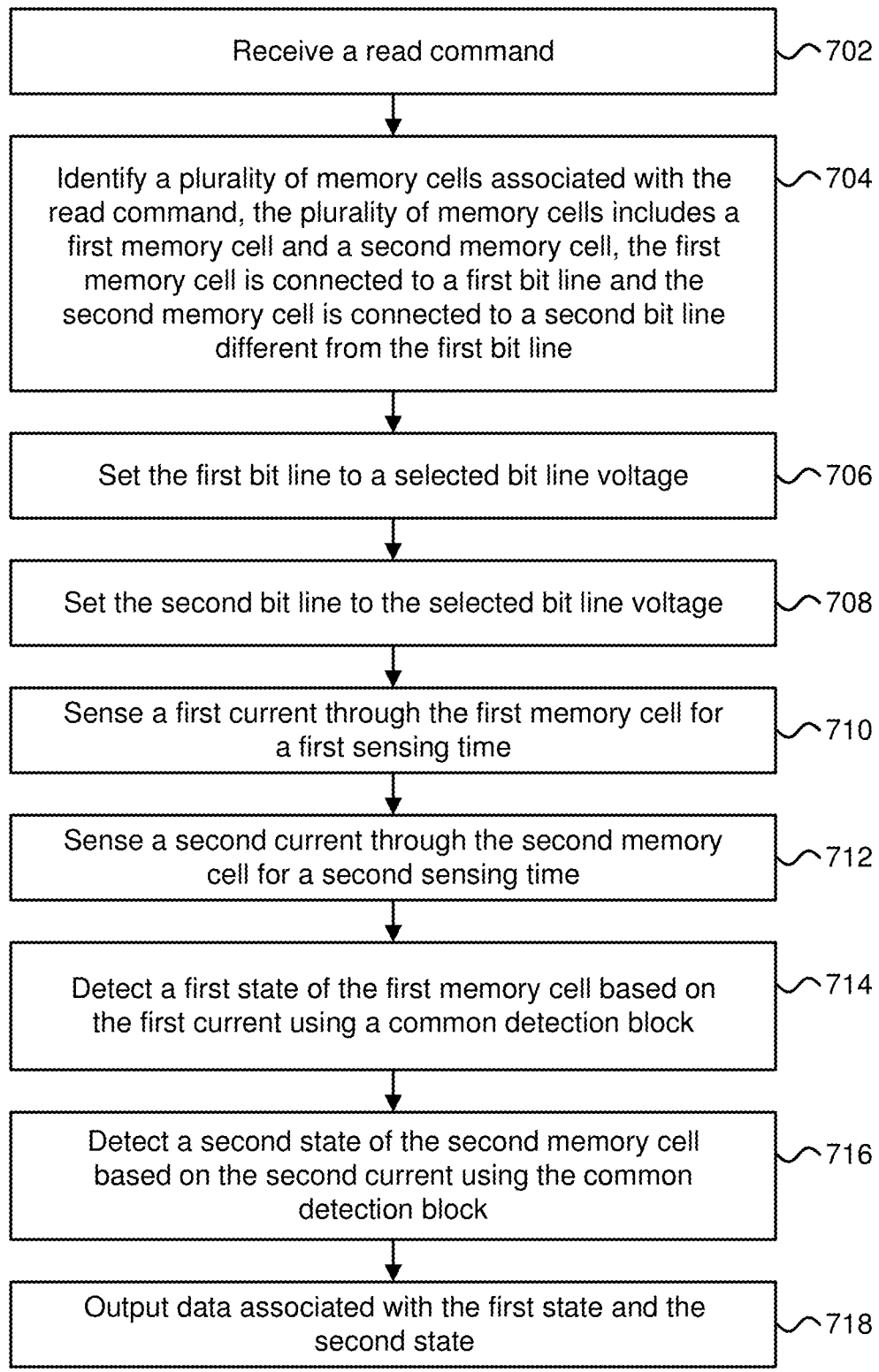
FIG. 7A is a flowchart describing one embodiment of a process for determining memory cell states during a read operation.

FIG. 7A is a flowchart describing one embodiment of a process for determining memory cell states during a read operation. In one embodiment, the process of FIG. 7A is performed by a memory chip, such as memory chip 102 in FIG. 1.

In step 702, a read command is received. In one embodiment, the read command may be received from a host to read one or more memory locations. In step 704, a plurality of memory cells associated with the read command is identified. The plurality of memory cells includes a first memory cell and a second memory cell. The first memory cell is connected to a first bit line and the second memory cell is connected to a second bit line different from the first bit line. In step 706, the first bit line is set to a selected bit line voltage. In one example, the first bit line may be precharged to a read voltage (e.g., 1.0V). In step 708, the second bit line is set to the selected bit line voltage. In one example, the second bit line may be precharged to the read voltage.

In step 710, a first current through the first memory cell is sensed for a first sensing time. In step 712, a second current through the second memory cell is sensed for a second sensing time. In one embodiment, the first sensing time may be equivalent to the second sensing time. In another embodiment, the first sensing time may be less than the second sensing time. In step 714, a first state of the first memory cell is detected based on the first current using a common detection block. In one embodiment, the common detection block may comprise a comparator, such as comparator 526 in FIG. 5B. In step 716, a second state of the second memory cell is detected based on the second current using the common detection block. In step 718, data associated with the first state and the second state is outputted. The data may be outputted from a read circuit, such as read circuit 508 in FIG. 5B, to a memory controller, such as memory chip controller 105 in FIG. 1A. The data may be outputted from a memory chip to a host.

Figure 7B:
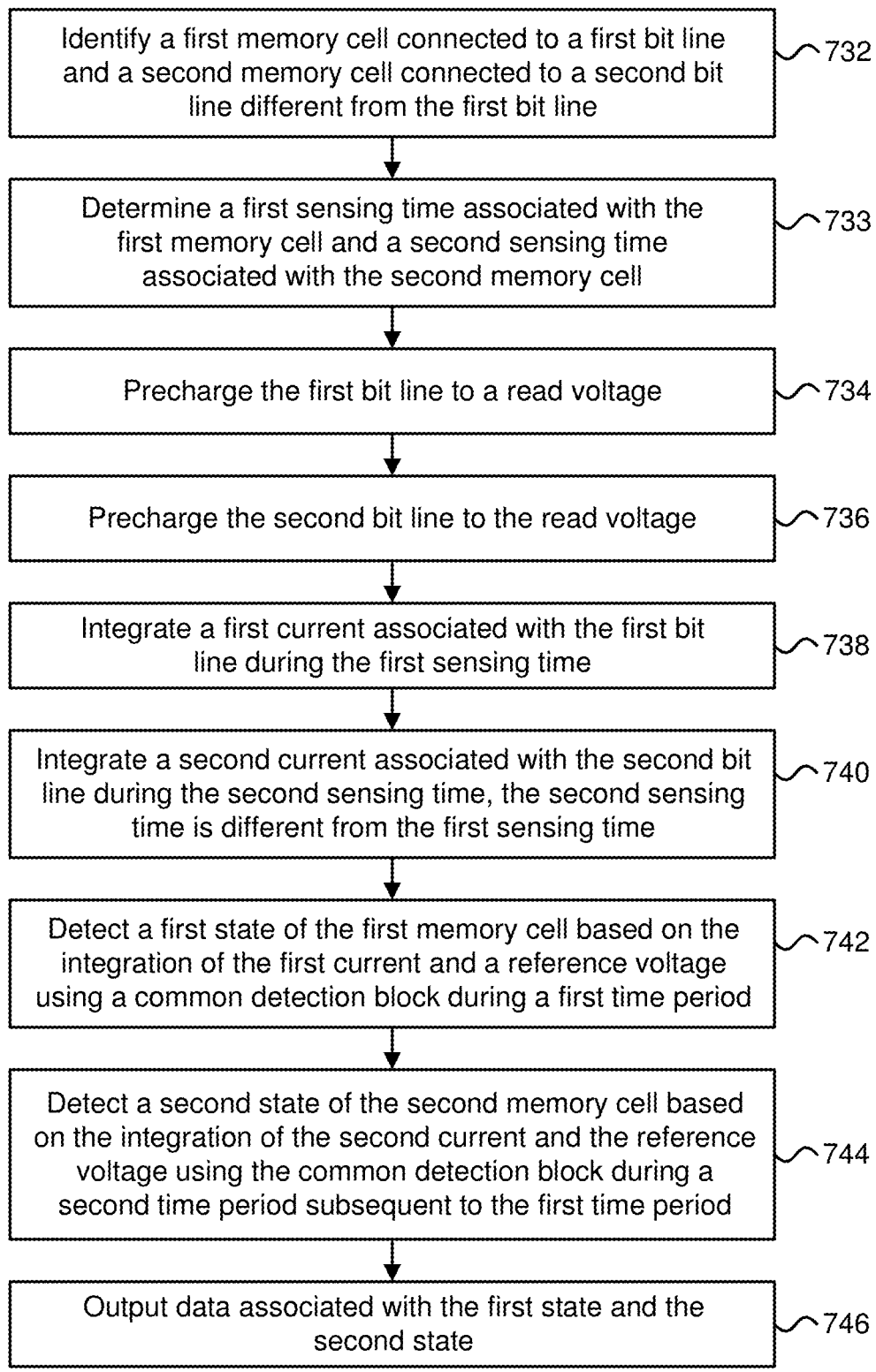
FIG. 7B is a flowchart describing an alternative embodiment of a process for determining memory cell states during a read operation.

FIG. 7B is a flowchart describing an alternative embodiment of a process for determining memory cell states during a read operation. In one embodiment, the process of FIG. 7B is performed by a read circuit, such as read circuit 508 in FIG. 5A.

In step 732, a first memory cell connected to a first bit line is identified and a second memory cell connected to a second bit line different from the first bit line is identified. In step 733, a first sensing time associated with the first memory cell is determined and a second sensing time associated with the second memory cell is determined. In some embodiments, the first sensing time may be different from (e.g., greater than or less than) the second sensing time. In one embodiment, the first sensing time may be longer than the second sensing time if detection of a first state of the first memory cell is performed subsequent to the detection of a second state of the second memory cell. The longer sensing time may reduce the number of read errors during a read operation (e.g., a longer sensing time provides a weakly conducting memory cell with more time to discharge an integration capacitor). In one example, the time period during which the first state of the first memory cell is determined using detection circuitry (e.g., a comparator) may be assigned based on a history of previous read errors (e.g., if the first bit line is associated with a previous error or if the first bit line is associated with a page that had an ECC error during a previous read operation, then the first state may be determined during the latest memory cell state detection time period).

In step 734, the first bit line is precharged to a read voltage. In step 736, the second bit line is precharged to the read voltage. In step 738, a first current associated with the first bit line is integrated during the first sensing time. In one embodiment, the first current may be integrated using an integration capacitor, such as integration capacitor 534 in FIG. 5B. In step 740, a second current associated with the second bit line is integrated during the second sensing time. In step 742, a first state of the first memory cell is detected based on the integration of the first current and a reference voltage. The first state may be detected using a common detection block during a first time period. In one example, the common detection block may comprise a comparator, such as comparator 526 in FIG. 5B. In step 744, a second state of the second memory cell is detected based on the integration of the second current and the reference voltage. The second state may be detected using the common detection block during a second time period subsequent to the first time period. In step 746, data associated with the first state and the second state is outputted.

One embodiment of the disclosed technology includes determining a first sensing time associated with a first memory cell connected to a first bit line, determining a second sensing time associated with a second memory cell connected to a second bit line different from the first bit line, integrating a first current associated with the first bit line during the first sensing time, integrating a second current associated with the second bit line during the second sensing time, and detecting a first state of the first memory cell based on the integration of the first current and a reference voltage. The detecting a first state is performed using a detection block during a first time period. The method further comprises detecting a second state of the second memory cell based on the integration of the second current and the reference voltage. The detecting a second state is performed using the detection block during a second time period subsequent to the first time period. The method further comprises outputting data associated with the first state and the second state.

One embodiment of the disclosed technology includes a plurality of memory cells, one or more managing circuits, and a read circuit. The plurality of memory cells includes a first memory cell connected to a first bit line and a second memory cell connected to a second bit line. The one or more managing circuits determine a first sensing time associated with the first memory cell and determine a second sensing time associated with the second memory cell. The read circuit is in communication with the first bit line and the second bit line. The one or more managing circuits in communication with the read circuit. The read circuit integrates a first current associated with the first bit line during the first sensing time and integrates a second current associated with the second bit line during the second sensing time. The read circuit detects a first state of the first memory cell based on the integration of the first current and a reference voltage using a detection block during a first time period. The read circuit detects a second state of the second memory cell based on the integration of the second current and the reference voltage using the detection block during a second time period subsequent to the first time period.

One embodiment of the disclosed technology includes determining a first sensing time associated with a first memory cell connected to a first bit line, determining a second sensing time associated with a second memory cell connected to a second bit line different from the first bit line, sensing a first current associated with the first bit line during the first sensing time, sensing a second current associated with the second bit line during the second sensing time, determining a first state of the first memory cell based on the first current using a comparator during a first time period, and determining a second state of the second memory cell based on the second current using the comparator during a second time period subsequent to the first time period. The comparator is time multiplexed such that the first state of the first memory cell is determined using the comparator during the first time period and the second state of the second memory cell is determined using the comparator during the second time period. The method further comprises outputting data associated with the first state and the second state.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a plurality of memory cells including a first memory cell connected to a first bit line and a second memory cell connected to a second bit line;
one or more managing circuits configured to determine a first sensing time associated with the first memory cell and determine a second sensing time associated with the second memory cell; and
a read circuit in communication with the first bit line and the second bit line, the read circuit configured to integrate a first current associated with the first bit line during the first sensing time and integrate a second current associated with the second bit line during the second sensing time, the read circuit configured to detect a first state of the first memory cell based on the integration of the first current and a reference voltage using a detection block during a first time period, the read circuit configured to detect a second state of the second memory cell based on the integration of the second current and the reference voltage using the detection block during a second time period subsequent to the first time period.

2. The apparatus of claim 1, wherein:
the second sensing time is greater than the first sensing time.

3. The apparatus of claim 1, wherein:
the second sensing time overlaps with the first time period during which the first state is determined.

4. The apparatus of claim 1, wherein:
the detection block comprises a comparator.

5. The apparatus of claim 4, wherein:
the comparator is time multiplexed such that the first state of the first memory cell is determined using the comparator during the first time period and the second state of the second memory cell is determined using the comparator during the second time period.

6. The apparatus of claim 1, wherein:
the one or more managing circuits configured to determine the first sensing time based on a number of read errors associated with the first bit line.

7. The apparatus of claim 1, wherein:
the first bit line comprises a vertical bit line.

8. The apparatus of claim 1, wherein:
the first memory cell is associated with a vertical NAND string.

9. The apparatus of claim 1, wherein:
the first memory cell comprises a two-terminal memory cell.

10. The apparatus of claim 1, wherein:
the read circuit is arranged on a memory die that includes non-volatile memory that is monolithically formed in one or more physical levels of memory cells having active areas disposed above a silicon substrate.

11. A system, comprising:
a controller configured to determine a first sensing time associated with a first memory cell connected to a first bit line and determine a second sensing time associated with a second memory cell connected to a second bit line; and
a read circuit configured to integrate a first current associated with the first bit line during the first sensing time and integrate a second current associated with the second bit line during the second sensing time, the read circuit configured to determine a first state of the first memory cell based on the integration of the first current and a reference voltage using a comparator during a first time period, the read circuit configured to determine a second state of the second memory cell based on the integration of the second current and the reference voltage using the comparator during a second time period subsequent to the first time period, the second sensing time overlaps with the first time period during which the first state is determined.

12. The system of claim 11, wherein:
the second sensing time is greater than the first sensing time.

13. The system of claim 11, wherein:
the comparator is time multiplexed such that the first state of the first memory cell is determined using the comparator during the first time period and the second state of the second memory cell is determined using the comparator during the second time period.

14. The system of claim 11, wherein:
the controller configured to determine the first sensing time based on a number of read errors associated with the first bit line.

15. The system of claim 11, wherein:
the first bit line comprises a vertical bit line.

16. The system of claim 11, wherein:
the first memory cell is associated with a vertical NAND string.

17. The system of claim 11, wherein:
the first memory cell comprises a two-terminal memory cell.

18. A non-volatile storage system, comprising:
a memory array including a first memory cell connected to a first bit line and a second memory cell connected to a second bit line;
one or more control circuits configured to determine a first sensing time associated with the first memory cell and determine a second sensing time associated with the second memory cell; and
a read circuit configured to integrate a first current associated with the first bit line during the first sensing time and integrate a second current associated with the second bit line during the second sensing time, the read circuit configured to detect a first state of the first memory cell based on the integration of the first current during a first time period, the read circuit configured to detect a second state of the second memory cell based on the integration of the second current during a second time period subsequent to the first time period, the second sensing time overlaps with the first time period during which the first state is detected.

19. The non-volatile storage system of claim 18, wherein: the second sensing time is greater than the first sensing time.

20. The non-volatile storage system of claim 18, wherein: the read circuit is arranged on a memory die that includes non-volatile memory that is monolithically formed in one or more physical levels of memory cells having active areas disposed above a silicon substrate, the first bit line comprises a vertical bit line that is orthogonal to a substrate of the memory die.

* * * * *